United States Patent [19]

Andreasen et al.

[11] Patent Number: 5,046,033

[45] Date of Patent: Sep. 3, 1991

[54] SYSTEM FOR TRANSFERRING TEST PROGRAM INFORMATION

[75] Inventors: David A. Andreasen, Blue Bell, Pa.; Dean J. Shea, Minneapolis, Minn.; Gregory P. Hackney, Ramona, Calif.

[73] Assignee: UNISYS Corporation, Blue Bell, Pa.

[21] Appl. No.: 391,075

[22] Filed: Aug. 9, 1989

[51] Int. Cl.⁵ ............................................ G01R 31/28
[52] U.S. Cl. ...................................... 364/580; 371/27
[58] Field of Search ............... 364/578, 579, 580, 200, 364/900; 371/23, 27

[56] References Cited

U.S. PATENT DOCUMENTS

| | | | |
|---|---|---|---|
| 4,168,527 | 9/1979 | Winkler | 364/579 |
| 4,382,286 | 5/1983 | Mitchell et al. | 364/900 |
| 4,404,639 | 9/1983 | McGuire et al. | 364/579 |
| 4,486,853 | 12/1984 | Parsons | 364/900 |
| 4,622,647 | 11/1986 | Sagnard et al. | 364/580 |
| 4,713,815 | 12/1987 | Bryan et al. | 371/29.1 |
| 4,766,595 | 8/1988 | Gollomp | 371/23 |
| 4,779,273 | 10/1988 | Beucler et al. | 371/27 |
| 4,903,267 | 2/1990 | Arai et al. | 371/27 |
| 4,945,488 | 7/1990 | Carver et al. | 364/474.24 |
| 4,977,531 | 12/1990 | Ogata et al. | 364/530 |

Primary Examiner—Parshotam S. Lall
Assistant Examiner—Ellis B. Ramirez
Attorney, Agent, or Firm—John B. Sowell; Mark T. Starr; Thomas J. Scott

[57] ABSTRACT

The present system is employed to generate and transmit information which is needed to construct or assemble truth tables and pertinent data which are directed to associated circuits which require testing. The present method employs a technique whereby information is nested, or compacted, in accordance with certain rules of grammar and is transmitted from a circuit design group to a vendor, i.e., a manufacturer of the circuit designed by a design group. When the nested information is expanded by a translator device, or by a translation program, at the manufacturer's location, it is directly expandable into truth table information for use by various logic testers. Each of the truth tables defines a specific function that the designer wants tested in the associated circuit. The manufacturer supplies the test platform hardware which generates the desired signal patterns defined by the truth table information and pertinent data. The present method is employed to more efficiently compact and transmit information which is ultimately translated into truth table and test data information to effect a test program for various test platforms. By way of example, in the present description, the circuit to which the compacted information is applicable is a hybrid semiconductor multicircuit package and the test information relates to test of the semiconductor chips in wafer form as well as the chips before and after being mounted in package form.

17 Claims, 6 Drawing Sheets

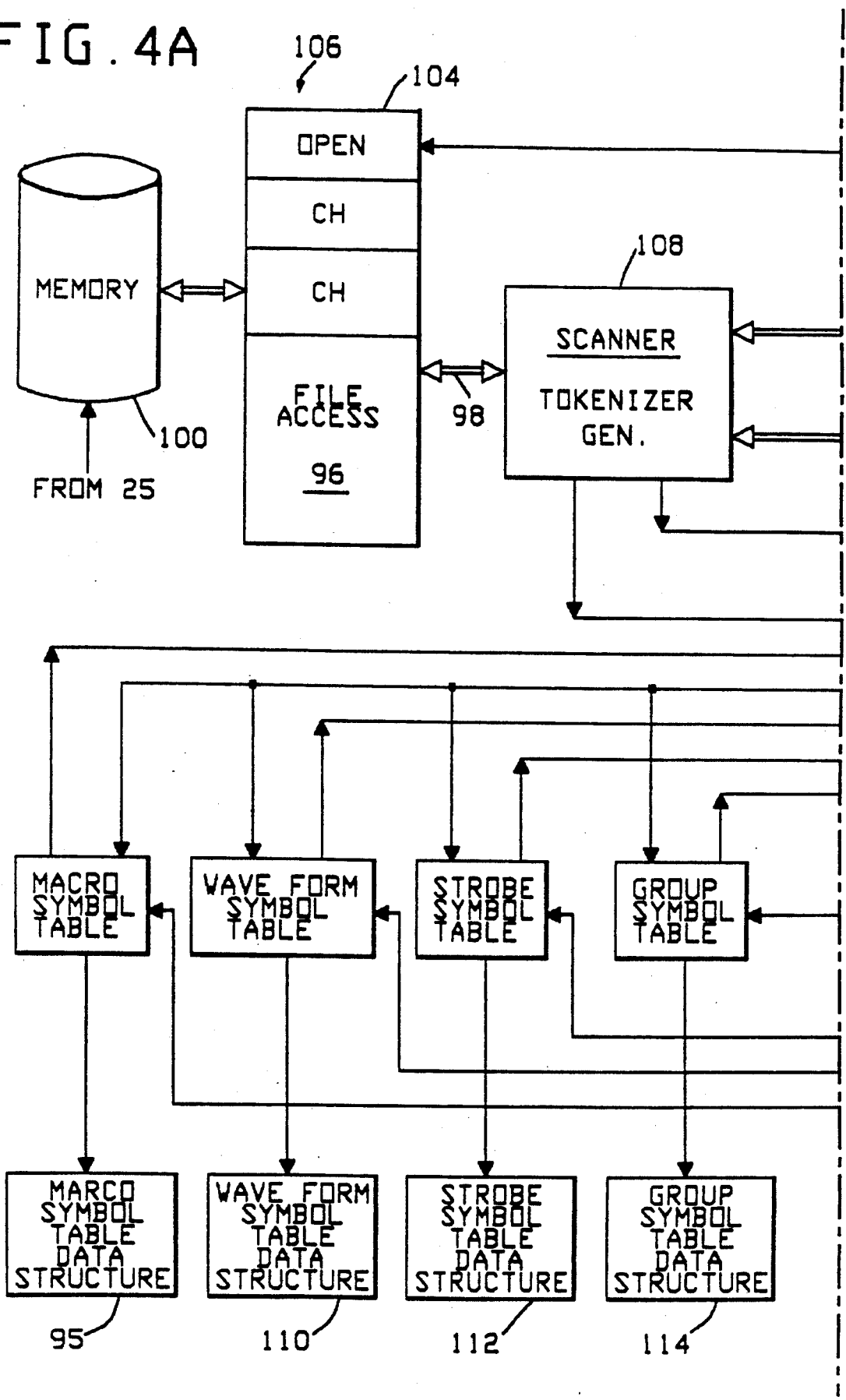

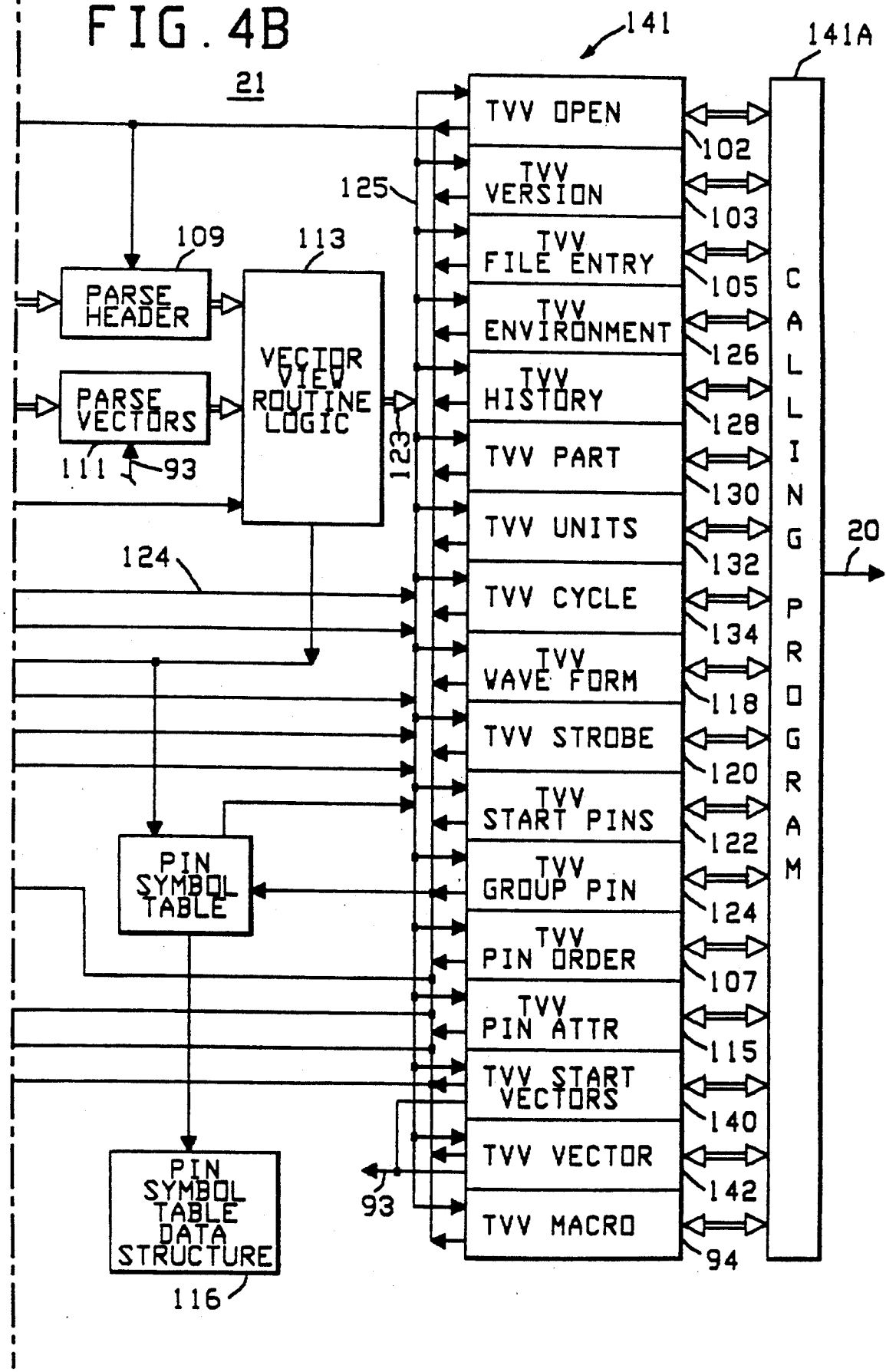

SYSTEM FOR TRANSFERRING TEST PROGRAM INFORMATION

BACKGROUND OF THE INVENTION

It is well understood that extensive testing of hybrid multichip boards is necessary. In recent times, the trend has been to miniaturize chips and chip circuits per se and such miniaturization has enabled the industry to locate more and more circuits on a single chip and more chips on a hybrid multichip board. The foregoing is evidenced by the popularity of VLSI circuits. On the other hand, the manufacture and packing of such circuits gives rise to all kinds of possible infirmities. The detection of those infirmities, prior to the release of the multichip or multicircuit boards for commercial use, understandably, has a very high priority. In the prior art, the circuit designer would design the circuit and then decide how it should be tested. He would generate a truth table or truth tables and establish parameters which define the nature of the test or tests. If the tests were to be performed at a remote chip manufacturer's location, the preferred test information would be sent along to the manufacturer by way of final form truth table information and stored on a magnetic tape or by some other form of mass storage. The time required to generate the tape information, in the early prior art format was not a prohibitive burden to the preparation of the method of testing at the manufacturer's location. However, as the number of circuits have increased on the chip and multicircuit board, testing itself has become more sophisticated and more of a problem than the design of the circuits. For instance, the truth tables required to define the test on a particular chip have become more numerous simply because there were more circuits located on a chip. Accordingly, the amount of time necessary to generate the truth table and test data information and the amount of memory storage required to handle such test information has become significant. When such test information was sent electronically from the design location to the manufacturer's location, it represented a significant burden on the transmission facilities and a burden to store such information at the received end.

The present method and system enables truth table and test data information to be transmitted in compacted form and reconstructed in its final usable form at the receiving end (the manufacturer's location). Accordingly, the transmission facilities are not burdened as was the case in the prior art nor is the storage capability at the receiving end as burdened. Further, the compacted standardized format and procedure enables different design locations to communicate directly with the same or different chip manufacturing locations while assuring complete uniformity and interchangeability of components and end products.

Heretofore at least Texas Instruments, Inc., a chip manufacturer, has prepared standardized test procedures in a form referred to as Test Description Language or TDL. This back end program has enabled designers of T.I. chips to more uniformly define test to be performed on their chips. It would be desirable to provide a system which would compact the test information at the front end in a format that could be expanded at the manufacturer's site for direct use with numerous test platforms made by different manufacturers.

SUMMARY OF THE DISCLOSURE

The test program information (i.e. the test list information (TIF) as depicted in Table 1), which is transmitted from the circuit design group to the manufacturer's location, is initially arranged by an autogeneration technique. Raw information, related to: circuit timing constraints; macro instructions; circuit characteristics; logic circuit arrangements; pin designations; voltages and circuit attribute names, among many items, is fed to a properly programmed computer such as a UNISYS 1100, or a UNISYS A17, or a state machine. The programmed computer, or state machine employing the proprietary circuit information of the type in the TIF effects an autogeneration of the header and test information as depicted, by way of example, in Table 1. The header information in compacted form is transmitted to second properly programmed computer or state machine (either of which may be the same computer hardware as handled the autogeneration of the header portion of the test list), and under the guidance of test case information, (which are individual statements or directions for the tester device) the vectors are autogenerated. The output from the vector autogeneration is a test list (i.e. a program such as depicted in Table 1). The test case information (TIF) is directed to what the circuit designer wants to have tested. In other words if a circuit designer wants to know whether or not an input signal applied to a certain pin or pins causes an output signal at a certain other pin or other pins, then information calling for such a test will be present in the test case information.

The header of the program, or test list, employed with the present method is written to introduce (in a first phase) a set of standard test signals such as waveforms and the like. Each different waveform has a different identifier or name. In addition, in the first phase of the header section there are introduced identifiers for: input pins; output pins; clock signal pins; internal pins and logic circuits such as flip-flops. In a second phase of the test list header, groups of different first phase identifiers are expressed together and each of these groups has an identifier which collectively identifies a particular group of first phase identifiers. The third phase of the header section introduces macro instructions and each different macro instruction includes second phase identifiers and/or other macro instruction. Finally, in accordance with the present method, the test list program sets out the action functions of the test list program, in machine readable language, by listing a plurality of vectors or step instructions. Each vector may include one or more macro instructions. The translator device at the chip manufacturer's location includes a translation program which expands each macro instruction by substituting for it the second phase identifiers which the macro instruction includes. The translator further substitutes, for each second phase identifier, the first phase identifiers defined by the last mentioned second phase identifier. The first phase identifiers, as expressed together, indicate the application of waveforms, or other signals, to selected ones of said input pins, output pins, clock pins, and flip-flops. It becomes apparent then that a single vector, or a single TIF instruction, can define a plurality of instructional (actually several hundreds) to be applied to a variety of different terminals or pins, in accordance with what the specified test intended to be accomplished.

The objects and features of the present invention will be better understood in accordance with the drawings wherein:

FIGS. 4 and 4A-4B are a more detailed block diagram of the translator of FIG. 3.

Figure 1:
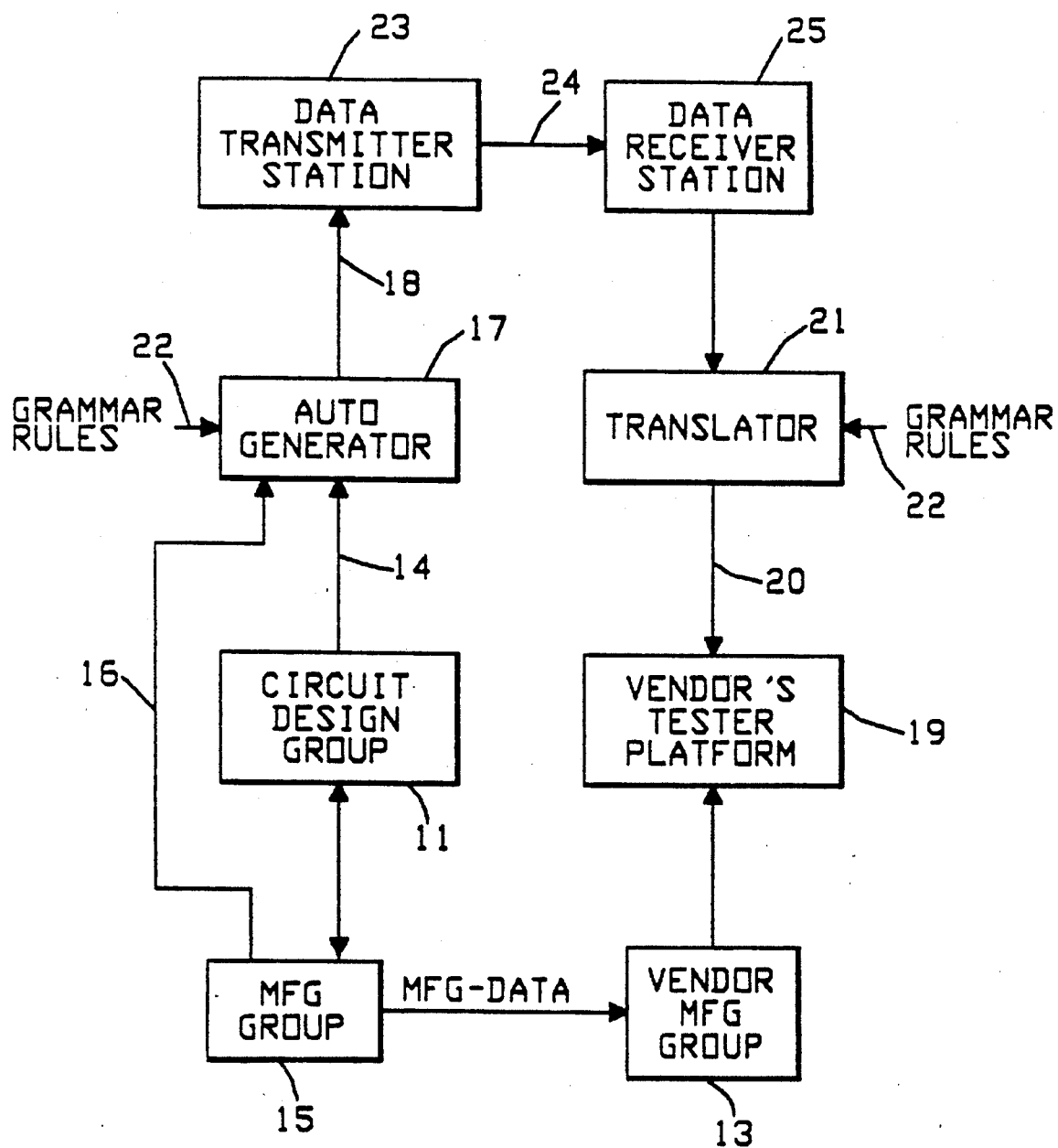
FIG. 1 is a schematic block diagram of a preferred embodiment system hardware that may be employed to generate, transmit and implement a program which has been devised in accordance with the present method.

Consider FIG. 1. In FIG. 1 there is shown a circuit design group 11. The circuits, which are eventually manufactured at the vendor manufacturing group 13, are designed at the circuit design group 11 location. Large computer manufacturers, for instance such companies as the UNISYS Corporation, design circuits for special or general use in the computer systems that UNISYS designs and markets. However, as is true with many such companies, the actual manufacture of the circuits is done either by a division of such a company or by an outside vendor such as Fujitsu Corporation, Motorola Corporation and others.

When a circuit, which has been designed by the circuit design group 11, is ready to be manufactured, the data necessary for such manufacturing is transmitted to the manufacturing design group 15 where such circuits are refined when considered from the standpoint of packaging, layout, etc. After the manufacturing design group 15 has provided its packaging input to the ultimate design of the circuit, the data relating thereto are transmitted to the vendor manufacturing group for ultimately manufacturing such circuits. While ordinarily the term "vendor" connotes a non-related (companywise) organization, that may not be true. The vendor manufacturing group may be a specialized division of the same company. The activity related to the circuits and the data defining the same, which is transmitted from the circuit design group 11 through the manufacturing group 15 to the vendor manufacturing group 13, is not part of the present invention but the background is appropriate in order to understand what is being accomplished by the present invention. As mentioned earlier, the testing problems for such circuits have become more difficult than the functional design of such circuits.

When the circuit design group 11 has finished its task and the information has been transferred to the vendor manufacturing group 13 for actual manufacture of such circuits, such circuit design information is also transferred to the autogenerator device 17 as shown by paths 14 and 16. Actually the autogenerator device 17 can be, and in most cases is, a programmed general purpose computer such as a UNISYS 1100 or a UNISYS A17, or a state machine. As part of the programming control in the autogenerator device 17, there are provided certain grammar rules at path 22 (as well as raw information) which were mentioned earlier in this description. The grammar rules 22 assist in causing the test list program to be compacted (encoded) and subsequently parsed and interpreted at the translator 21 (in accordance with the grammar rules) so that the information has the intended meaning when it is used at the vendor's tester 19.

The output 18 of the autogenerator device 17 is a machine readable test list, which is generated in accordance with certain algorithms, or programs and information which is fed to the autogenerator device at 14, 16. Such autogeneration programs are able to cope with the many permutations which arise when all of the input pins, output pins, waveforms etc. (which are employed to make the circuit function) are considered. In any event, autogeneration as a concept is well understood and does not require a detailed explanation to support the novel part of the present invention. The autogeneration process employed will be discussed in more detail in connection with FIG. 2. As the test list (TIF, which is made up of vectors and which in turn are necessary to test the circuit), is generated by the autogenerator, the information is broken out and grouped into a header section having four categories as will be explained hereinafter. In addition to the four categories of header information produced by the autogenerator device additional information may include specifications by the designer that a particular type fixture will be needed in which the multicircuit board, that is to be tested, is mounted. As will become more apparent, when we consider Table 1, other information which is provided indicates when the program was generated, both date, time and timewise from historical information. All of such information may be useful to the vendor when the vendor is arranging the fixture hardware. Some Table 1 information is for the designer's identification use because the designer wants to be sure that the program which he is dispatching, is truly going to the correct vendor for use in his test platform for testing the specified circuits, chips and multicircuit boards.

The detailed discussion of the test list program and how it is a nested program, with the capability of expanding, will be undertaken in the discussion of Table 1. With respect to FIG. 1, it should be understood that this nested program, which does not include truth tables per se, is transmitted at path 18 to the data transmitter 23. The data transmitter 23 may be a device, such as a modem, if in fact the information is to be transferred over ordinary telephone lines 24 to the data receiver device 25. Other forms of data transmission and receiving terminals 23, 25 may be used. The nested program information is received by the data receiver 25 and is transmitted therefrom to a translator 21. The translator 21, which is discussed in more detail in connection with FIGS. 3 and 4, includes a control program which employs the grammar rules 22 whereby the information which is transmitted can be expanded so that ultimately truth table information will be available to the vendor's tester 19 via path 20.

It should be understood that algorithms of this type, which are used in autogeneration of the test list are well understood in the art. It should be further understood that the transmitter device 23 and the receiver device 25 may be commercially available devices. The vendor's tester 19 or test platform is provided with different fixtures to hold the wafer or chips or circuits and is normally a proprietary design of a particular vendor.

The translator 21 is where the test list nested program will be expanded to provide truth table information to the vendor's tester 19. The translator retains the test list in the nested form and when the vendor's tester 19 is employed to test a particular circuit, the tester 19 can call upon the translator to provide truth table information to the vendor's tester. To say it another way, the nested program that is transmitted from the autogenerator 17 to the translator 21 provides the tools by which a truth table, or truth tables, can be constructed at the vendor's site. In effect there has been a compression, as exemplified by the nested program, that reduces the amount of time required to transmit the equivalent information (as required in the prior art) from the design group to the vendor's tester. It also reduces the burden (of the prior art) on any transmission lines, while it also reduces the amount of storage that has been required in the prior art. In the prior art systems it was necessary to store the large number of truth tables on, for instance, magnetic tapes and then physically transport that stored information to the vendor's site.

Refer now to line 3 of Table 1 which comprises the first part of Appendix A, mentioned earlier. Prior to the expression "UNITS=1" being transmitted, the program writer indicates to the translator means 21, or to the personnel who are involved in the test, that a fixture will be needed in which the multicircuit board will be fitted and the program writer will indicate the kind of fixture that will be necessary. The testing machines of the various vendors are equipped to test various kinds of multicircuit boards. Those multicircuit boards very often use different fixtures, that is devices into which the pins of the module are located, in order to have signals applied to the pins of the multicircuit board.

In our discussion to follow, we will consider that all of the expressions from "UNITS" on through to the end of MACRO READRAM (as found at line 7, page 12—Table 1) to be the header section. We identify this information as the header because it contains the tools with which the vectors, or the individual instructions, work, to generate truth table information which is necessary to test the multicircuit board. The header information is ultimately stored in a RAM in the translator means 21 (FIG. 1) to be used in accordance with the directions of the vectors or instructions. Note that the header starts with "UNITS=1" and under the grammar rules with which this system works, "1" (if it has no units definition) will mean picoseconds. In Table 1, under the expression "UNITS", we next find the expression "CYCLE=39,000" and that means literally that the cycle equals 39,000 "UNITS" and hence 39,000 picoseconds. Under the term "CYCLE" we find that there are eight expressions of waveforms. Each of those waveforms has a particular identifier. Notice that the first waveform is identified as "WRITECLOCK". The use of the waveform "WRITECLOCK" will become apparent when we discuss the role of the vectors. The vector will refer to the identifier "WRITECLOCK" and not to "waveform". As is apparent in Table 1 there is further information provided in the test list program with respect to the "WRITECLOCK" waveform. Notice that opposite "WRITECLOCK" there is the expression "0=0,0". The first part of the expression "WRITECLOCK 0" simply provides a distinction between two "WRITECLOCK" expressions the other being "WRITECLOCK 1". The expression "=0,0" means that if the vector calls for "WRITECLOCK 0=0" the translator device, or whatever device is implementing the program, will provide a signal which starts at ZERO voltage or whatever that ZERO level voltage might be. The foregoing is the meaning of the first zero preceding the comma. The second zero (i.e. the zero after the comma) means that the signal will continue at the ZERO value for the full 39,000 picoseconds cycle. In accordance with the grammar rules employed with the present embodiment a "comma" is a separator but acts to put the items separated into a subgroup. Note further, that on the line below the expression "WRITECLOCK 0" there is any expression "1=0,0 9368, 1 11378, 0". That last expression means that if the vector calls for a "WRITECLOCK 1", the waveform will initially start at the ZERO voltage level. Starting at the ZERO voltage level is dictated by the first "0" preceding the comma. The rest of the expression means that the waveform will stay at ZERO value until 9,368 picoseconds have transpired. Thereafter the leading edge of the waveform will rise to the ONE value and the waveform will stay at the ONE value for 11,378 picoseconds and then fall off at the trailing edge to the ZERO value for the remainder of the 39,000 picoseconds in the cycle. IT should be understood that the creator of the test list program knows beforehand that in order to check, at least the functions that he is concerned about, it will be necessary for the manufacturer to apply a waveform WRITECLOCK 1. So waveform WRITECLOCK 1 becomes a tool to be used, through a vector or vectors, to effect a translation operation.

Table 1

```
TIF 3.0 LEVEL 4;
Environment MAN_GENERATED CREATED "06/02/88 13:00"
   Fixture "FAMILY = M10KXWEC; TYPE = ECL100K52; PACKAGE = MAMX2;";
HISTORY "Made from the msm3drtx/tif/template from Charlie B.";
PART "FAMILY = 96 CUSTOMER = 006 OPTION_NUMBER = 17 DATE 06/03/88";
UNITS = 1;
CYCLE = 39000;
WAVEFORM = WRITECLOCK    0 =  0, 0
                         1 =  0, 0  9368, 1 11378, 0;
WAVEFORM = WRITEADDRESS  0 =  0, 1  9390, 0 19438, 1
                         1 =  0, 0  9390, 1 19438, 0;
WAVEFORM = WRITESTROBE   0 =  0, 1 10931, 0 16851, 1
                         1 =  0, 1;
WAVEFORM = READCLOCK     0 =  0, 0
                         1 =  0, 0 14352, 1 24094, 0;
STROBE = READCHECK  20442 23442;
WAVEFORM = READADDRESS   0 =  0, 1  9368, 0 16742, 1
                         1 =  0, 0  9368, 1 16742, 0;
```

```
INPUTS (59)
    C17, DIEPAD=187, ECL_PULL_DOWN_L, FANIN=1
    J17, DIEPAD=159, ECL_PULL_DOWN, FANIN=1
    F02, DIEPAD=14, ECL_PULL_DOWN, FANIN=1
    T02, DIEPAD=64, ECL_PULL_DOWN_L, FANIN=1
    S02, DIEPAD=61, ECL_PULL_DOWN_L, FANIN=1
    R01, DIEPAD=62, ECL_PULL_DOWN_L, FANIN=1
    S01, DIEPAD=34, ECL_PULL_DOWN_L, FANIN=1
    S18, DIEPAD=151, ECL_PULL_DOWN_L, FANIN=1
    R18, DIEPAD=155, ECL_PULL_DOWN_L, FANIN=1
    C02, DIEPAD=8, ECL_PULL_DOWN_L, FANIN=1
    B01, DIEPAD=23, ECL_PULL_DOWN_L, FANIN=1
    B02, DIEPAD=19, ECL_PULL_DOWN_L, FANIN=1
    A02, DIEPAD=16, ECL_PULL_DOWN_L, FANIN=1
    B03, DIEPAD=251, ECL_PULL_DOWN_L, FANIN=1
    C18, DIEPAD=160, ECL_PULL_DOWN_L, FANIN=1
    B18, DIEPAD=164, ECL_PULL_DOWN_L, FANIN=1
    A18, DIEPAD=166, ECL_PULL_DOWN_L, FANIN=1
    A17, DIEPAD=169, ECL_PULL_DOWN_L, FANIN=1
    B16, DIEPAD=207, ECL_PULL_DOWN_L, FANIN=1
    H17, DIEPAD=162, ECL_PULL_DOWN_L, FANIN=1
    A03, DIEPAD=236, ECL_PULL_DOWN_L, FANIN=1
    A04, DIEPAD=247, ECL_PULL_DOWN_L, FANIN=1
    A05, DIEPAD=242, ECL_PULL_DOWN_L, FANIN=1
    A06, DIEPAD=238, ECL_PULL_DOWN_L, FANIN=1
    A07, DIEPAD=233, ECL_PULL_DOWN_L, FANIN=1
    A08, DIEPAD=228, ECL_PULL_DOWN_L, FANIN=1
    A09, DIEPAD=224, ECL_PULL_DOWN_L, FANIN=1
    A10, DIEPAD=217, ECL_PULL_DOWN_L, FANIN=1
    A11, DIEPAD=213, ECL_PULL_DOWN_L, FANIN=1
    A12, DIEPAD=204, ECL_PULL_DOWN_L, FANIN=1
    A13, DIEPAD=200, ECL_PULL_DOWN_L, FANIN=1
    A14, DIEPAD=195, ECL_PULL_DOWN_L, FANIN=1
    A15, DIEPAD=191, ECL_PULL_DOWN_L, FANIN=1
    H01, DIEPAD=24, ECL_PULL_DOWN_L, FANIN=1
    F01, DIEPAD=15, ECL_PULL_DOWN_L, FANIN=1
    E01, DIEPAD=31, ECL_PULL_DOWN_L, FANIN=1
    D01, DIEPAD=29, ECL_PULL_DOWN_L, FANIN=1
    C01, DIEPAD=25, ECL_PULL_DOWN_L, FANIN=1
    001, DIEPAD=20, ECL_PULL_DOWN_L, FANIN=1
    G17, DIEPAD=175, ECL_PULL_DOWN_L, FANIN=1
    P02, DIEPAD=47, ECL_PULL_DOWN_L, FANIN=1
    P01, DIEPAD=94, ECL_PULL_DOWN_L, FANIN=1
    N02, DIEPAD=58, ECL_PULL_DOWN_L, FANIN=1
    N01, DIEPAD=53, ECL_PULL_DOWN_L, FANIN=1
    M02, DIEPAD=49, ECL_PULL_DOWN_L, FANIN=1
    M01, DIEPAD=44, ECL_PULL_DOWN_L, FANIN=1
    J18, DIEPAD=161, ECL_PULL_DOWN_L, FANIN=1
    H18, DIEPAD=165, ECL_PULL_DOWN_L, FANIN=1
    F18, DIEPAD=179, ECL_PULL_DOWN_L, FANIN=1
    E18, DIEPAD=220, ECL_PULL_DOWN_L, FANIN=1
    D18, DIEPAD=188, ECL_PULL_DOWN_L, FANIN=1
    G02, DIEPAD=11, ECL_PULL_DOWN_L, FANIN=1
    G18, DIEPAD=170, ECL_PULL_DOWN_L, FANIN=1
    P17, DIEPAD=144, ECL_PULL_DOWN_L, FANIN=1
    P18, DIEPAD=157, ECL_PULL_DOWN_L, FANIN=1
    N17, DIEPAD=140, ECL_PULL_DOWN_L, FANIN=1
    N18, DIEPAD=141, ECL_PULL_DOWN_L, FANIN=1
    M17, DIEPAD=137, ECL_PULL_DOWN_L, FANIN=1
    M18, DIEPAD=146, ECL_PULL_DOWN_L, FANIN=1

OUTPUTS (42)
    E02, DIEPAD=18, ECL_60
    D02, DIEPAD=6, ECL_60
    D17, DIEPAD=182, ECL_60
    E17, DIEPAD=173, ECL_60
    C03, DIEPAD=2, ECL_60
```

```
                    B17, DIEPAD=190, STECL_10MA_40R
                    H02, DIEPAD=27, STECL_10MA_40R
                    A16, DIEPAD=171, ECL_60
                    U04, DIEPAD=65, ECL_60
                    U05, DIEPAD=69, ECL_60
                    U06, DIEPAD=74, ECL_60
                    U07, DIEPAD=78, ECL_60
                    U08, DIEPAD=87, ECL_60
                    U09, DIEPAD=91, ECL_60
                    U10, DIEPAD=98, ECL_60
                    U11, DIEPAD=102, ECL_60
                    U12, DIEPAD=107, ECL_60
                    U13, DIEPAD=112, ECL_60
                    U14, DIEPAD=116, ECL_60
                    U15, DIEPAD=121, ECL_60
                    U16, DIEPAD=110, ECL_60
                    F17, DIEPAD=184, ECL_60
                    U01, DIEPAD=40, ECL_60
                    L01, DIEPAD=39, ECL_60
                    T01, DIEPAD=38, ECL_60
                    K01, DIEPAD=35, ECL_60
                    J01, DIEPAD=30, ECL_60
                    J02, DIEPAD=28, ECL_60
                    U03, DIEPAD=45, ECL_60
                    K02, DIEPAD=33, ECL_60
                    T03, DIEPAD=81, ECL_60
                    U02, DIEPAD=43, ECL_60
                    S17, DIEPAD=134, ECL_60
                    U17, DIEPAD=142, ECL_60
                    T16, DIEPAD=125, ECL_60
                    S16, DIEPAD=128, ECL_60
                    L17, DIEPAD=153, ECL_60
                    K17, DIEPAD=154, ECL_60
                    T17, DIEPAD=145, ECL_60
                    T18, DIEPAD=149, ECL_60
        L18, DIEPAD=150, ECL_60
        K18, DIEPAD=156, ECL_60

CLOCKS (1)
        L02, DIEPAD=36, ECL_PULL_DOWN, FANIN=2

IOS (2)
        R02, DIEPAD=56, ECL_25_OFF_IO, FANIN=1
        R17, DIEPAD=132, ECL_25_OFF_IO, FANIN=1

#FLIPFLOPS
        CLKMAJ RTEST RSCIPD RSCIPC RSCIPB RSCIPA RDOR0 RDOR1 RDOR2
        RDOR3 RDOR4 RDOR5 RDOR6 RDOR7 RDOR8 RDOR9 RDOR10 RDOR11 RDOR12
        RDIR0 RDIR1 RDIR2 RDIR3 RDIR4 RDIR5 RDIR6 RDIR7 RDIR8 RDIR9 RDIR10
        RDIR11 RDIR12 RDIPE RWAPE RRAPE R RHUNG RINIT RWREFF RWRAD0 RWRAD1
        RWRAD2 RWRAD3 RWRAD4 RWRAD5 RWRAD6 RWRAD7 RWRAD8 RWRAN0 RWRAN1
        RWRAN2 RWRAN3 RWRAN4 RWRAN5 RWRAN6 RWRAN7 RWRAN8 RWADS OBSAP OBDD0
        OBDD1 OBDD2 OBDD3 OBDD4 OBDC0 OBDC1 OBDC2 OBDC3 OBDC4 OBDB0 OBDB1
        OBDB2 OBDB3 OBDB4 OBDA0 OBDA1 OBDA2 OBDA3 OBDA4 OBA OASAP OADD0
        OADD1 OADD2 OADD3 OADD4 OADC0 OADC1 OADC2 OADC3 OADC4 OADB0 OADB1
        OADB2 OADB3 OADB4 OADA0 OADA1 OADA2 OADA3 OADA4 OAA OAW00 OAW01
        OAAC OAACE OACN00 OACN01 OAACB0 OAACB1 OAACT OAAR OAARE OAARF0
        OAARF1 OAARB0 OAARB1 OAART OALDE OACNI0 OACNI1 OAWI0 OAWI1 OAHUNG
        OBW00 OBW01 OBAC OBACE OBCN00 OBCN01 OBACB0 OBACB1 OBACT OBAR
        OBARE OBARF0 OBARF1 OBARB0 OBARB1 OBART OBLDE OBCNI0 OBCNI1 OBWI0
        OBWI1 OBHUNG OUSADY OUSAK3 OUSAK2 OUSAK1 OUSAK0 ;

GROUP WNTAD B02, X, WRITEADDRESS A02, X, WRITEADDRESS B03, X, WRITEADDRESS
        C18, X, WRITEADDRESS B18, X, WRITEADDRESS A18, X, WRITEADDRESS
        A17, X, WRITEADDRESS B16, X, WRITEADDRESS;
```

```
GROUP RNTAD B02,X,READADDRESS A02,X,READADDRESS B03,X,READADDRESS
      C18,X,READADDRESS B18,X,READADDRESS A18,X,READADDRESS
      A17,X,READADDRESS B16,X,READADDRESS;
GROUP DATIN A03 A04 A05 A06 A07 A08 A09 A10 A11 A12 A13 A14 A15;
GROUP DAOUT U04,X,,READCHECK U05,X,,READCHECK U06,X,,READCHECK
      U07,X,,READCHECK U08,X,,READCHECK U09,X,,READCHECK U10,X,,READCHECK
      U11,X,,READCHECK U12,X,,READCHECK U13,X,,READCHECK U14,X,,READCHECK
      U15,X,,READCHECK U16,X,,READCHECK;
GROUP WTRAMCTRL C02,1 L02,1,WRITECLOCK;
GROUP RDRAMCTRL C02,0 L02,1,READCLOCK;
GROUP CLOCKPIN L02;
GROUP STROBEPIN F02;
GROUP YCTRL T02 S02;
GROUP SCANINPIN C17;
GROUP SCANOUTPIN B17;
#GROUP INITIALVALUES #FLIPFLOPI [1],1 #FLIPFLOPI [2],1
                     #FLIPFLOPI [58],0 C02,1;
#MACRO SCANIN;
    #FOR i IN #FLIPFLOPI [];
        [59:x] [42:x] [1:x] [4:x] @YCTRL, [2:1] @CLOCKPIN, 0
                                          @SCANINPIN, %i;
        [59:x] [42:x] [1:x] [4:x] @YCTRL, [2:1] @CLOCKPIN, 1
                                          @SCANINPIN, %i;
    #ENDF;
#ENDM;
#MACRO INITRAM;
    [59:x] [42:x] [1:x] [4:x] [302:x] @INITIALVALUES @SCANIN;
#ENDM;
#MACRO WRITERAM;
    [59:x] [42:x] [1:x] [4:x] @WTRAMCTRL
    @WNTAD, %0 @DATIN, %1 @STROBEPIN, 0, WRITESTROBE;
#ENDM;
#MACRO READRAM;
    [59:x] [42:x] [1:x] [4:x] @RDRAMCTRL
    (@RNTAD, %0) @DAOUT, %1 @STROBEPIN, 1, WRITESTROBE;
#ENDM;
VECTORS                      0 COLUMN     1 COLUMN
#SECTION AC ;
[59:X] [42:X] [1:X] [4:X] [302:X] @INITRAM ;
[408:X] @WRITERAM,,[1:00000000],[1:0101010101010];
[408:X] @WRITERAM,,[1:00000001],[1:0101010101010];
[408:X] @WRITERAM,,[1:00000010],[1:0101010101010];
[408:X] @WRITERAM,,[1:00000011],[1:0101010101010];
[408:X] @WRITERAM,,[1:00000100],[1:0101010101010];
[408:X] @WRITERAM,,[1:00000101],[1:0101010101010];
[408:X] @WRITERAM,,[1:00000110],[1:0101010101010];
[408:X] @WRITERAM,,[1:00000111],[1:0101010101010];
[408:X] @WRITERAM,,[1:00001000],[1:0101010101010];
[408:X] @WRITERAM,,[1:00001001],[1:0101010101010];
[408:X] @WRITERAM,,[1:00001010],[1:0101010101010];
[408:X] @WRITERAM,,[1:00001011],[1:0101010101010];
[408:X] @WRITERAM,,[1:00001100],[1:0101010101010];
[408:X] @WRITERAM,,[1:00001101],[1:0101010101010];
[408:X] @WRITERAM,,[1:00001110],[1:0101010101010];
[408:X] @WRITERAM,,[1:00001111],[1:0101010101010];
[408:X] @WRITERAM,,[1:00010000],[1:0101010101010];
[408:X] @WRITERAM,,[1:00010001],[1:0101010101010];
[408:X] @WRITERAM,,[1:00010010],[1:0101010101010];
[408:X] @WRITERAM,,[1:00010011],[1:0101010101010];
[408:X] @WRITERAM,,[1:00010100],[1:0101010101010];
[408:X] @WRITERAM,,[1:00010101],[1:0101010101010];
[408:X] @WRITERAM,,[1:00010110],[1:0101010101010];
[408:X] @WRITERAM,,[1:00010111],[1:0101010101010];
[408:X] @WRITERAM,,[1:00011000],[1:0101010101010];
[408:X] @WRITERAM,,[1:00011001],[1:0101010101010];
[408:X] @WRITERAM,,[1:00011010],[1:0101010101010];
[408:X] @WRITERAM,,[1:00011011],[1:0101010101010];
```

```
[408:X] @WRITERAM,,[1:00011100],[1:01010101010101];
[408:X] @WRITERAM,,[1:00011101],[1:01010101010101];
[408:X] @WRITERAM,,[1:00011110],[1:01010101010101];
[408:X] @WRITERAM,,[1:00011111],[1:01010101010101];
[408:X] @WRITERAM,,[1:00100000],[1:01010101010101];
[408:X] @WRITERAM,,[1:00100001],[1:01010101010101];
[408:X] @WRITERAM,,[1:00100010],[1:01010101010101];
[408:X] @WRITERAM,,[1:00100011],[1:01010101010101];
[408:X] @WRITERAM,,[1:00100100],[1:01010101010101];
[408:X] @WRITERAM,,[1:00100101],[1:01010101010101];
[408:X] @WRITERAM,,[1:00100110],[1:01010101010101];
[408:X] @WRITERAM,,[1:00100111],[1:01010101010101];
[408:X] @WRITERAM,,[1:00101000],[1:01010101010101];
[408:X] @WRITERAM,,[1:00101001],[1:01010101010101];
[408:X] @WRITERAM,,[1:00101010],[1:01010101010101];
[408:X] @WRITERAM,,[1:00101011],[1:01010101010101];
[408:X] @WRITERAM,,[1:00101100],[1:01010101010101];
[408:X] @WRITERAM,,[1:00101101],[1:01010101010101];
[408:X] @WRITERAM,,[1:00101110],[1:01010101010101];
[408:X] @WRITERAM,,[1:00101111],[1:01010101010101];
[408:X] @WRITERAM,,[1:00110000],[1:01010101010101];
```

The waveforms identified as "WRITEADDRESS, WRITESTROBE, READCLOCK and READADDRESS" are all interpreted in the same way as the "WRITECLOCK", that is they are defined by the time period numbers that are provided in Table 1 as part of the header and are tools employed through a vector or vectors. The waveform "STROBE", which really has an identifier of "READCHECK", indicates that the gate signal for a strobe will start at 20,442 picoseconds into the cycle and will end at 23,442 picoseconds in the cycle. The space separation of two expressions such as 20442 and 23442 is part of the rules of grammar employed by the embodiment described herein and is interpreted to act as a separator. Accordingly, if the vector calls for a READCHECK, then the vendor's tester will provide a gate signal during the above described times and the strobing, of whatever is being strobed, will take place within that gate signal time.

Figure 2:
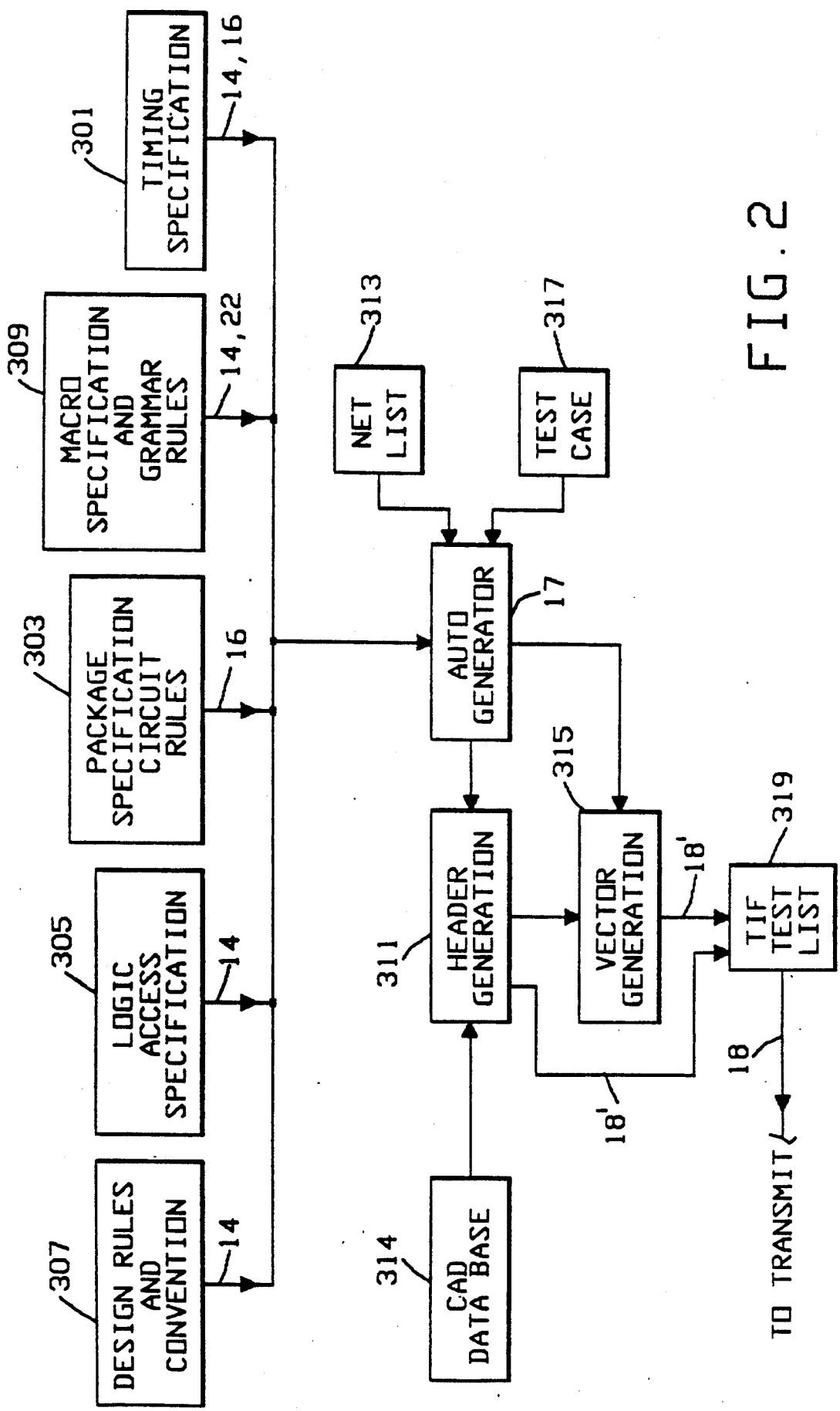
FIG. 2 is a block diagram of a preferred embodiment autogenerator.

Below the waveform "READADDRESS" we find the test list program expressing "INPUTS". Next to the word "INPUTS", in accordance with the grammar rules, is the expression (59). The expression (59) indicates that there are 59 input pins on the device (not shown). That pin information is provided to be helpful to the personnel employing the test list program at the manufacturer's location. Note that the first input pin is identified as C17. The particular pins on the particular multicircuit board, which is being tested by the particular test program depicted in FIG. 2, are identified by having the columns defined by letters and the rows defined by numbers. Accordingly, C17 is an input pin located in the C column, the third column, and it is located on the seventeenth row. Although C17 appears first there is no significant reason therefor. After the expression "C17" there is the expression "DIEPAD=187". Because "C17" and "DIEPAD=187" are separated by a comma, it means (in accordance with the grammar rules) that the expression "DIEPAD=187" is a modifier of expression C17. "C17, DIEPAD=187" indicates to the program implementer that C17 is a pin that is accessible to the outside world, and is internally connected to a pad identified as 187 located internally in the circuit (not shown). In the particular multicircuit board, which is to be tested by the present test list program, the pads are blocks of conducting material that enable signals to be passed into a logic circuit on the module such as a flip-flop, or a RAM. The pads are identified by numbers which start at some arbitrary position which is selected as "one". The numbers identifying the pads increase, or get higher, as the pads are counted clockwise until all of the pads have been numbered. The translator, or translation program, is made aware of the starting point. In the particular structure we are considering, there is a pad which is number "187" and it is connected to the input pin C17. Note further that after the expression "187" there is a comma followed by the expression "ECL-PULL-DOWN-L",. The expression ECL indicates that the circuit, to which the pad 187 is connected, is in fact an emitter-coupled logic circuit. In addition, the expression indicates that the emitter-coupled logic circuit is so constructed that the voltage output is "pulled down" in response to a low signal at the input. This information is of importance to the implementor personnel because the implementor personnel must know what signals can be applied to the various fixture connections. When the module or multicircuit board to be tested is fitted into the fixture, the implementor personnel will want to know that the pin C17 is connected to an ECL-PULL-DOWN-L circuit. Now further note that after "L", there is a further expression "FANIN=1". That expression is a further indication to the implementor personnel that there should only be one input signal path from the DIEPAD 187 to the ECL circuit. Bear in mind that the implementor personnel, involved in the test program, are normally the vendor personnel, or the producer of the multicircuit module. The next input pin "J17" is going to be connected to an emitter-coupled logic circuit which is characterized as a PULL-DOWN but does not indicate an L. This simply means that in response to either a high or a low input signal, the ECL, to which the pin J17 is connected, will provide a low voltage or a pulled down voltage. All of the input pins through "M18" on page 10—Table 1 are identified in the same way and there appears to be no necessity for further discussion thereof.

The next group of identifiers in Table 1 comes under the expression "OUTPUTS" found on page 10—Table 1. Along side of the expression "OUTPUT" is an expression (42) and in accordance with the grammar rules that indicates that there are 42 output pins. The first OUTPUT identifier is E02 and the same identifier ground rules apply thereto as were applicable to the INPUT pins. That particular OUTPUT pin is located in the E column in the second row. Although E02 appears first there is no significant reason therefor. Note further that the pin E02 is connected to the "DIEPAD 18" and the DIEPAD 18 has been located, or identified, as discussed earlier. The DIEPAD 18 is connected to an emitter-coupled logic circuit which is further identified by the expression "60". The expression "60" means that the ECL circuit is designed to limit ringing. It can be recognized from Table 1 that the pins below the pin E02 are identified similarly until we get to the pin B17. From the discussion above it becomes apparent that the pin B17 is connected to the DIEPAD 190 and that the DIEPAD 190 is connected to a logic circuit which is identified as STECL-10MA-40R. The expression STECL-10MA-40R means that the circuit operates with 10 milliamps and includes a particular type of output circuit. Some manufacturers are interested in this information and some are not. The remainder of the output pins are identified in a fashion similar to that which has been discussed above and it would appear that no further discussion is necessary.

The next expression in the first phase of the header section is found on page 11—Table 1 as "CLOCKS (1)". Under the expression "CLOCKS" there is an expression L02 and in accordance with the grammar rules of the present embodiment, the expression indicates that the pin L02 is the clock pin. Accordingly, when a vector calls for a clock signal it will be applied to the pin L02. It should be noted that the pin L02 is connected to the "DIEPAD 36." It should be further noted that the DIEPAD 36 is connected to emitter-coupled logic which is a pull down type circuit. Further note that there are two signal pads connected to the pin L02. The foregoing condition is expressed by the identifier adjectives i.e. by the "FANIN=2" expression. Under the "CLOCK" expression we find an expression "IOS(2)". The expression "IOS(2)" indicates input/output devices and indicates that there are two such devices. The input/output devices are identified as being available on the pins RO2 and R17. Note the pin RO2 is connected to DIEPAD 56 and that in turn is connected to an emitter-coupled logic 25 OFF-IO which indicates a cutoff characteristic of the circuit that is useful to some manufacturers and of no concern to other manufacturers. The expression FANIN=1 indicates that there is only one circuit path between the pin RO2 and the DIEPAD=36. Identifying language for the pin R17 is very similar to that expressed above and no further explanation appears necessary.

Below the expression for the input/output pins we find the expression # FLIPFLOPS. The order, in which the flip-flops are arranged in this section of the header, is very significant because it represents the register arrangement of the flip-flops. In other words the arrangement enables the tester, or personnel conducting the test, to know how signals would pass through the chain of flip-flops, if signals were advanced therethrough. Each of the flip-flops, in the "# FLIPFLOPS" section, has a name and if, indeed, there is a way to get in and out of the flip-flops from, or to, the outside world, as opposed to passing signals internally, the translator device will have use for such information.

After the "# FLIPFLOPS" section of the header, we have a second phase of the header which is comprised of group related signals. By combining certain first phase identifiers together, in a group, and further providing a group identifier, or a second phase identifier, a great deal of instruction information can be transmitted by simply transmitting the group identifier. Note in Table 1, the first expression of the second phase of the header. The first expression of the second phase is entitled "GROUP WNTAD" which stands for Group Write Address. When a vector includes this last mentioned group, it will appear as "WNTAD". Note further that there is a space between the phrase "GROUP WNTAD" and the pin expression B02. According to the grammar rules, previously mentioned, a space indicates that the pin B02 is not related to the write address per se but is instead related to the concepts that follow thereafter separated by commas. The concepts separated by commas are related to each other as a subgroup and as subgroups, are related to the expression "GROUP WNTAD". In other words, B02,X,WRITEADDRESS indicates that the write address waveform will be applied to the pin B02 when, for instance, a vector calls for WNTAD. The X between the B02 and WRITEADDRESS simply indicates that it makes no difference what signal might be on pin B02 when the WRITEADDRESS waveform is applied. The remaining pins and waveforms in the group are interpreted the same way. Accordingly, the WRITEADDRESS waveform is applied to each of the pins B02, A02, B03, C18, B18, A18, A17, and B16.

Note (on page 11—Table 1) that the second expression in the second phase of the header, or the group phase of the header, is GROUP RNTAD which stands for Read Address. When a vector includes this last mentioned group, it will appear as RNTAD. Note further that there is a space between "GROUP RNTAD" and the pin expression B02. According to the grammar rules, a space indicates that the pin B02 is not related to the read address per se, but is instead related to the concepts that follow thereafter and are separated by commas. The concepts separated by commas are related to each other as a subgroup and the subgroups are related to each other to make up the group expression (in this case "GROUP RNTAD"). In other words, B02, X,READADDRESS indicates that the READ ADDRESS waveform will be applied to the pin B02 when, for instance, a vector calls for RNTAD. The X between the expression B02 and read address simply indicates that it makes no difference what signal might be on pin B02 when the READADDRESS waveform is applied. The remaining pins and waveforms in GROUP RNTAD are interpreted in the same way. Accordingly the READADDRESS waveform is applied to each of the pins B02, A02, B03, C18, B18, A18, A17, and B16 when RNTAD is part of a vector.

As can be determined from Table 1, the third Group expression is "GROUP DATIN". When a vector calls for DATIN it will be followed by some attribute such as "%1" as found in MACRO WRITERAM below (on page 12—Table 1). The expression %1, according to the grammar rules means that a value substitution is to be made. The substitution value is normally called a parameter. Whatever the signal attributes (of DATIN) might be they are applied to the pins in the group expression, namely, A03, A04, A05, A06, A07, A08, A09, A11, A12, A13, A14, and A15. As can be seen on page 12—Table 1, the MACRO WRITERAM calls for a "1" to be applied to all of the pins related to DATIN, hence there will be a "1" applied to each of the pins A03 through A15.

The GROUP expression below GROUP DATIN is

"GROUP DAOUT". DAOUT means Data Read Out. The "DAOUT" expression shown in Table 1 indicates that a READCHECK waveform will be applied to each of the pins U04 through U16. The "X" after each of such pins means that the program does not care what signals might be present on those pins when the READCHECK waveforms are applied.

The next expression "GROUP WTRAMCTRL" means Ram Control signal during a Write operation and indicates that when a vector calls for a Write Ram Control that a "1" will be applied to the pin C02 and a WRITECLOCK 1 signal will be applied to the pin L02. Now it will be remembered that on the first page of Table 1 there was a WRITECLOCK 0 and a WRITECLOCK 1. In order to find out what signal is actually being applied to the pin: L02 the translator must go to the WRITECLOCK 1 waveform and thereat is the indication of the gate signal that will be applied, as explained before.

The sixth GROUP expression is "GROUP RDRAMCTRL" which means "Read Ram Control". As can be seen in Table 1 when the vector calls for RDRAMCTRL there will be a 0 signal applied to the pin C02 and the READCLOCK 1 gate signal will be applied to the pin L02. In the following five GROUP expressions we simply find that the CLOCKPIN is pin L02, STROBEPIN is pin F02, and YCTRL indicates two available pins, those pins being T02 and S02. We also find that SCANINPIN is pin C17 and SCANOUTPIN is pin B17.

Finally, the last GROUP expression is "GROUP INITIALVALUES" and it states that when the vector calls for INITIALVALUES or indeed if a MACRO INSTRUCTION calls for INITIALVALUES, the flip-flops will be addressed in order with the first flip-flop in the chain being dealt with first. The foregoing information is determined because there is a "1" in the bracket after the first expression # FLIPFLOPI, indicating the position of the flip-flop that is to be dealt with first. There is also an "1" at the end of the word FLIPFLOP indicating the input side. The "1" after [1] indicates there is a 1 value placed on the input side of the first flip-flop. Note that the INITIALVALUES expression also says that the "I" or input side of flip-flop number 2 (the flip-flop being recognized as the number two flip-flop because of the "2" written in brackets) there should be placed a "1" value. The expression INITIALVALUES further says that for flip-flop 58 there should be a "0" placed on the input side and finally that there should be a "1" on pin C02. The foregoing represents the INITIALVALUES in the event that they are called for.

We then find in Table 1 the third phase of the header, namely, the MACRO INSTRUCTION phase. The first MACRO INSTRUCTION is MACRO SCANIN. The expression # FOR i in # FLIPFLOPI [ ] means that # is a marker to indicate a formal argument. The expression indexes the flip-flop state items in the list FLIPFLOPS. MACRO SCANIN says that initially the program does not care what signals are on the input pins that are represented by [59:X], or the output pins represented by [42:X], or the clock pin which is [1:X] or the I/O pins which are identified by the expression [4:X]. However, SCANIN further says in [2:1] that the Y CONTROL GROUP will be applied to both of the pins S02 and T02 (not shown). The SCANIN instruction further says apply a "0" value signal to pin L02 which is the clock pin and the SCANINPIN part of the MACRO SCANIN instruction says to look at that instruction and find out what it is doing with "i". With respect to "i" the MACRO SCANIN instruction says apply the instruction signals while calling for each of the flip-flops in order. Since SCANIN is usually used with another instruction other concepts are usually involved. If the foregoing procedure is followed we see that the SCANIN instruction says for "i" apply signals (whatever is called for), to the flip-flops, in their order such as flip-flop 1, flip-flop 2, flip-flop 3, etc. The second line of the MACRO SCANIN instruction is the same as the first line except that it will be noted that there is a "1" placed on the CLOCKPIN L02. The instruction on the first line will be followed by the instruction on the second line.

The next MACRO instruction is MACRO INITRAM. When the MACRO instruction INITRAM appears in a vector, it simply says that the program does not care what signals are initially on the output pins, or the input pins, or on the clock pins, or on the I/O pins, or what inputs there might be on the 302 flip-flops. The INITRAM simply says apply the INITIAL VALUES and follow the MACRO SCANIN instructions. Note that the MACRO INITRAM is an example of one MACRO instruction calling for another MACRO instruction as well as a GROUP instruction. It follows that a third phase instruction (MACRO instruction) in a vector can call upon another third phase instruction as well as a group instruction in order to expand to what the creator of the program intended.

The next MACRO instruction is MACRO WRITERAM. Note that this MACRO instruction says that the program does not care what signals are applied to the output pins, or input pins, or the clock pin, or the I/O pins. It also says apply a WTRAMCTRL instruction. Accordingly, the translator would go to the GROUP instructions and find WTRAMCTRL. The translator would find that the signal "1" is to be applied to the pin C02 and that the WRITECLOCK 1 waveform is to be applied to pin L02. Look again at the MACRO instruction WRITERAM and note that it calls for a WNTAD,%0. Now if we go to the expression WNTAD we note there are many pins, 8 pins exactly, B02 through B16. The "%0" indicates that if that expression (%0) occurs look at the 0 column of the vector phase and use all of those values as the values of the write address. To make that clear, if we look at the second vector in Table 1 , we find that WRITERAM is followed by [1:00000000] which is in the zero column. This means that when that vector is being expanded all those zeros are to be applied to the pins B02 through B16 as defined in the expression WNTAD of the device under test (DUT). The next expression in the WRITERAM MACRO instruction is DATIN and note that it is followed by a comma and a "%1". The %1 says look at the second set of values (the one column) in the vector definition. If we look at that second set it is "[1:0101010101010]. Those thirteen parameters will be applied to the pins A03 through A15 as previously defined in the GROUP DATIN expression which is on page 10—Table 1. Note further that the MACRO WRITERAM says that the WRITESTROBE 0 waveform should be applied to the STROBEPIN which we find (from the GROUP expression at page 11) to be F02.

Finally, the MACRO READRAM is the same as the MACRO WRITERAM except that the values in the 0 column vector are applied to the pins of the GROUP RNTAD while the values in the 1 column of a vector are applied to the pins in the DAOUT GROUP expression.

The particular program of Table 1 is a simplified or compacted program so that it can be readily understood and yet the reader can sense how the details can be machine read and expanded and used to pass on a tremendous amount of information. Actually the program is set up to read regular information into the RAMS in the circuit being tested, and read information out of the RAMS while being checked. The first vector is [59:x] [42:x] [1:x] [4:x] [302:x] @INITRAM. The foregoing vector says that the program does not care initially what is on any of the 408 access points internal to the chip but that the program wants whatever is specified by a MACRO INITRAM to be accomplished. The [408:X] relates to the truth table or substrate side to be modified. The information to the right of "@" relates to a modification instruction shown as a MACRO instruction. If we go to MACRO INITRAM which has been explained above we will undertake to apply the group INITIALVALUES as well as SCANIN. When applying the INITIAL VALUES, the translator system will load all of the flip-flops but it will only be active to apply a predetermined value at flip-flop 1, flip-flop 2 and flip-flop 58 as well as pin C02. After that has been accomplished the second vector will be executed and we will note that we will be continually applying the values in Column 0 and Column 1 in response to the WRITERAM instructions. Note that in column 0 the address changes by 1 binary value for each vector while the DATIN address (column 1) remains the same. This pattern continues until the program gets to the 229th address which is on the first line of the 8th page of Appendix A. Starting with the 230th address (which is the second line on page 8 of Appendix A), the program alternates between writing into RAMS and reading out of RAMS. The alternating effort stops at the 288th address (the last line on page 8 of Appendix A). The program then asks for a WRITERAM only for addresses 289 through address 315. From address 316 to address 468, the program instructs the tester to alternate between "reading from" to "writing into" the RAMS.

The program from the address 469 to the address 528 has only the READRAM operation active. Starting with address 529 through address 588, the program will reintroduce alternating WRITERAM and READRAM. Further, from the address 589 through the address 768 only the READRAM will be active. The program again changes starting the alternation at address 769 through address 888 with both WRITERAM and READRAM being included and finally from address 889 through address 903 only the READRAM will be effective. The foregoing changes from WRITERAM to READRAM are necessary because that format is what the circuit designer needed by way of test.

It should be understood that a MACRO instruction, because it can refer to other MACRO instructions can accommodate as many as 10,000 lines or more of truth table information. It should be further understood that every vector is the equivalent of at least one line of truth table information. Note that the vectors in Table 1 are generated using the tools from the header information preceding the vectors, so that in the course of transmitting the information, the tools regenerate the test program. The vectors are used to generate truth table information at the site of the manufacturer. Accordingly, the transmitted information is relatively small compared to the possible expanded truth table information into which it can be expanded. "Nesting" of the different instructions makes the expansion possible and provides the basis for reducing transmission time and a reduction of loading the transmission facility. The grammar rules that are employed by the autogenerator 17 and translator 22 are extremely useful in conveying further information or instruction because they enable encoding and decoding (parsing and interpreting) of the information and the translator fills in the information concepts simply because of the grammar rules. Many of the grammar rules were pointed out in this description, but it should be understood that other grammar rules could be employed so long as such rules provide a basis for encoding (compacting) the information and for subsequent decoding (expanding) it.

Refer now to FIG. 2. In the discussion of FIG. 1, it was suggested that the creator of the program originally sets up the test by employing an autogeneration technique. The technique of autogeneration is well understood and need not be explained in detail in this description. As was explained above, the autogeneration device can be a UNISYS 1100 or a UNISYS A17 EDP or a state machine. It will be recalled that in the first phase of the header information, the test list program (Table 1), there is provided cycle times and waveforms and that information is provided from a memory means 301 entitled timing specification. It will also be recalled that the test list program (Table 1) provided information about input pins, output pins, internal pins, internal storage elements; and that information is provided from the memory means 303. Further, it will be recalled that the flip-flops were identified and their connected order was specified and that information is provided from memory means 305. It should be recalled that after the first phase information, the test list programs (Table 1) provided GROUP expressions which were made up of first phase expressions. The GROUP expressions are formulated by the header generator 311 comprising the CPU of the computer (or the state machine) by arranging the raw information from memories 301, 303 and 305 with the grammar rules from memory 309 under the guidance of the proprietary information from memory means 313 and the CAD data base 314. Finally, the header generation means 311 is fed MACRO specification information from the memory 309 which is used in the CPU of the header generation means 311 to construct a set of MACRO instructions. Accordingly, the memory of the header generator 311 has all of the tools (i.e. first phase expressions, GROUP expressions, and MACRO expressions) to provide, under proper guidance, a set of the VECTOR expressions. The test case information at block 317 is held in the memory of the EDP and operates with the "tools" from the header memory 313 to generate header information 311 and a set of VECTORS 315. The VECTORS 315, of course, are going to actuate the test platform machine to test the circuits that the designer wants tested. The actual testing is usually performed at the manufacturer's site. In any event, the VECTOR generator 315, which may have a separate EDP unit (i.e. separate from the header EDP generator), or the same EDP device, finally generates the test list program at 319 (TIF exemplified by Table 1).

Figure 3:
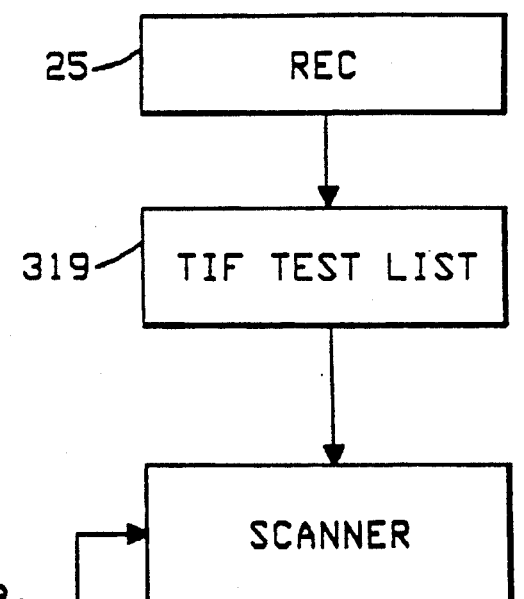
FIG. 3 is a block diagram of a translator showing its inputs and outputs.
Figure 3:
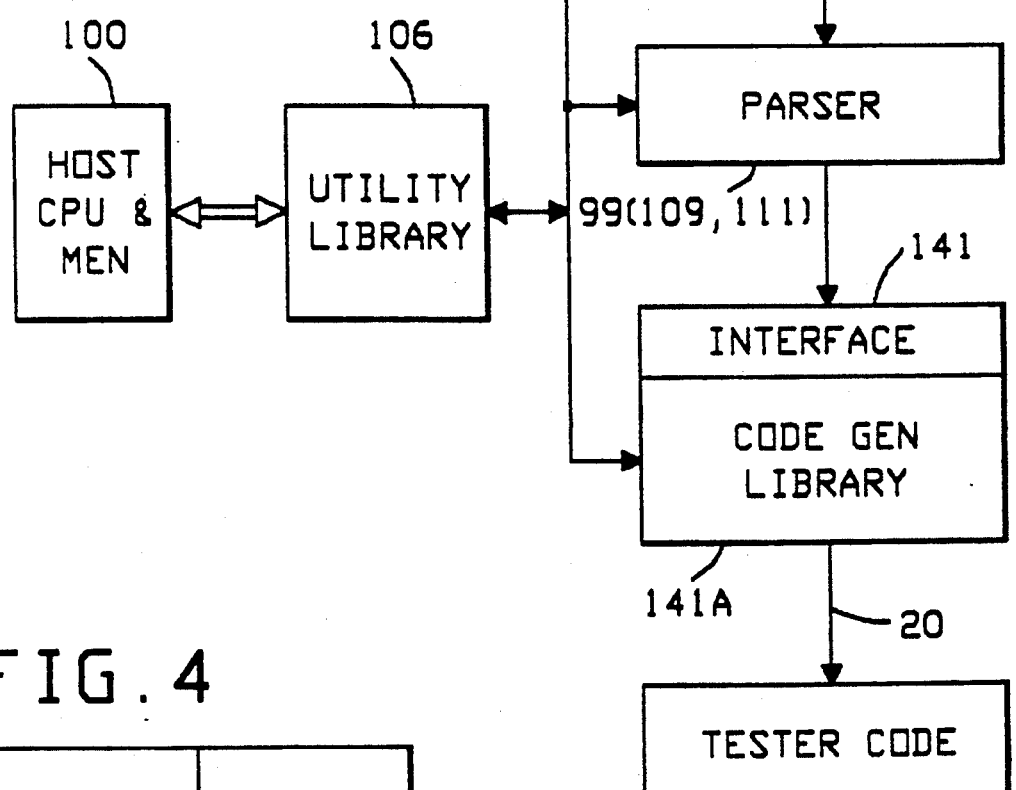

Refer now to FIG. 3 showing a preferred embodiment translator 21 shown in greater detail than in FIG. 1. The TIF test list 319 is shown being received at receiver 25 where it is made available to the translator 21.

When the TIF test list 319 is prepared in the form of a tape or other non volatile memory format it may be read by the translator 21 which comprises a scanner 108 coupled to a parser 99 which in turn is coupled to a procedure interface 141 which comprises part of the code generation library for calling program 141A. The calling program or code generation program is coupled to the parser 99, the scanner 108 and is shown coupled to the TIF test list 319 which was generated in FIG. 1 by the autogenerator and transmitted by line 18 and transmitter 23. It will be understood that the TIF list per se which is generated at the output of the autogenerator, is not critical to the present invention. Bus 98 is coupled to the scanner 108, parser 99 and code generation library 141, 141A via standard interfaces which connects to a standard interface on the utility library 106 shown having two blocks, one entitled OPEN (104) for actively coupling the scanner to the memory 100 of the host services and one entitled file access 96 for assessing information from memory 100. The code generation library 141A or calling program generates the tester code information at block 19 via bus 20 as shown in FIGS. 1 and 4 to be explained hereinafter.

Figure 4:
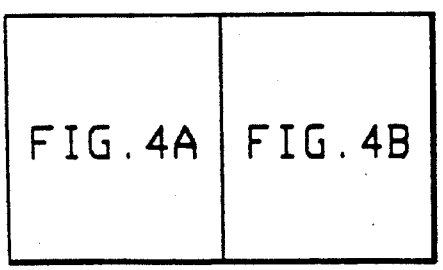

Refer now to FIG. 4 showing a detailed block diagram of the scanner parser and its cooperation with other elements of the translator 21 to provide the aforementioned tester code on output line 20.

FIG. 4 depicts a program arrangement which is employed in the preferred embodiment translator 21 comprising parser 99, scanner 108 and calling program 141A and which is used with either a UNISYS 1100, UNISYS A17 or other computer systems. It should be understood that while the data manipulation to accomplish the translation, in the preferred embodiment, is done with the program depicted in FIG. 4 and is done with a UNISYS 1100 or a UNISYS A17, other computer systems could be used or the logic concepts of FIG. 4 could be effected by special purpose logic circuits and/or software.

The translator operates in the following fashion as shown in FIG. 4. The nested program which is generated by the autogenerator 17 (i.e., the program shown in Table 1 and Appendix A) is stored by the storage means 100 in FIG. 4 at the translator 21. When the circuit manufacturer needs the program for testing, the "open" signal procedure or operation 102 is energized which in turn energizes the "open" channel 104 of the file access interface 106. It should be understood that the file interface 106 can be a software interface arrangement or can be a logic circuit interface. In the preferred embodiment, the information from the storage means 100 is constantly trying to pass into the interface 106. However, the system has been arranged so that the storage information is accessed only in response to the interface sending control signals thereto. Each of the channels in the interface, i.e., CH, OPEN and FILE ACCESS, etc., serves to deal with the information coming from the memory means 100 to preliminarily define the bit signals into meaningful groups such as characters or tokens. The TIF bit signals are machine read from the memory means 100 and presented in the format defined by the grammar rules of Appendix B. Therefore, the translator system processes the machine read groups of zeros and ones as characters. The grammar rules provide the basis for grouping the ones and zeros into tokens or groups of characters.

The further data manipulation of the characters will be partially determined at the scanner station 108. In other words, as a series of ones and zeros is defined as a character, part of those ones and zeros will be compared against preloaded ones and zeros in the scanner 108. Under the control or direction of the parse header 109 or the parse vectors 111, the scanner 108 will direct the characters along one of the following paths, namely through the parse header 109, through the parse vector 111, through the translator (TVV 113) vector view routine logic 113 or directly to the input bus 125 via line 124. One of the main objects of the translator is to load registers 95, 110, 112, 114 and 116 which store the concepts, respectively, of MACRO symbols, waveform symbols, strobe symbols, group symbols, and pin symbols which have already been discussed with respect to Table 1. The "1" and "0" signal arrangements of the foregoing concepts are stored in the registers 95, 110, 112, 114, and 116 as operators or procedures and they will be brought therefrom in response, respectively, to the energization of the TVV program interface procedures 94, 118, 120, 124, and 122 respectively. In a similar fashion, the "1's" and "0's" signal arrangement respectively identified as the environment, history and parts, similar to units and cycle header information (as were discussed in connection with Table 1) will be brought from the scanner and really represents a part of a program language. The present system does not operate with any of the popular languages such as BASIC, or PASCAL or the like, but employs the grammar rules as the basis of communicating directions to the testing machine or other forms of intelligence. Appendix B presents a set of grammar rules as well as examples for using those grammar rules. The grammar rules set forth in Appendix B are used in the preferred embodiment of the present invention. The programmer must know what his program is to accomplish. If he knows, for instance, that he wants data read into RAMS he must be aware of the TIF statements or expressions, within the grammar rules that will convey the notion that data is to be read into RAMS. Knowing what expressions, within the grammar rules he can employ to accomplish the reading of data into the RAMS permits him to include that expression or operation in the header. For instance, an expression or operation set forth in the grammar rules can be included in the header section (as described earlier), as a tool, to be compacted as part of the vector expressions. A person skilled in the art of programming can employ the rules of grammar, expressions or statements, set forth in Appendix B to construct a header section for a particular problem related to testing a particular circuit. The language or grammar rules, per se, lend themselves to a certain degree of compacting data and the further compacting by GROUP expressions as well as MACRO instructions enables the present system to transmit testing information to the manufacturer with a reduction in the burden on the transmission channels as well as the reduced requirement for memory.

In addition, the TIF programmer often desires to express his test in terms of the internal storage elements. The TIF format allows the programmer to write vectors which express the state of the internal storage elements and to also write MACROS, which when applied to the vectors, expand them into other vectors which express values to be applied to external pins of the device under test. The values applied to the external pins load predetermined desired values into the internal storage elements so that proper simulated test condition exist. Thus, the TIF programmer is permitted to write the test program in a format tokenizer channels 108 respectively, in response to the energization of positions 126, 128, 130, 132, and 134.

The TVV program interface 141 operates in a commutational fashion. In other words, the interface 141 operates in a cyclical manner whereby each of the positions 94, 105 and 118–132 when energized fetches a desired portion of the program shown in Table 1 and Appendix A.

It will be recalled from the discussion of Table 1 that the program ultimately ends up with test platform code vectors and the vectors at bus 20 which are the basic instructions to the testing machine or platform 19. When the scanner 108 receives the vectors from the file access interface 106, they are directed by the parse header 109 to the TVV routine registers 113. The TVV routine registers 113 have data manipulation ability and they manipulate the vectors in accordance with the directions or wishes of the manufacturer. It will be recalled that the vectors have MACRO expressions contained therein as laid out in Table 1. If the manufacturer can handle the MACRO expressions (without expansion) on his testing machine, then he may want to leave the vectors in the form shown in Table 1. However, if the manufacturer wants all of the vector information to be completely expanded, he will so advise the translator designer and the vector view will be arranged to alter the vectors to remove all need for interpretation of MACRO expressions. Accordingly, FIG. 4 shows the path between the TVV routine logic 113 and the TVV interface 141 as being processed to provide a desired "vector view" on bus 123. The "TVV start vector" procedure 140 and the "TVV vector" procedure 142 control signals are transmitted to the parse-vector control circuit 111 via bus 93 which causes the vectors stored in logic 113 to be sequentially advanced as discussed earlier with reference to Table 1.

Throughout the present description there have been many references to the grammar rules. In particular, in the description of the program of Table 1 there was described the significance of certain symbols or the significance of expressions such as %1 or %0. Currently, in the art of programming and in particular with reference to the present arrangement, or method, a grammar rule, (or a set of grammar rules), that corresponds to the procedure in which the desired test was originally generated. Storage elements in a chain may be sequentially loaded from one pin and latch scan test on all types of storage elements may be performed on internal storage elements. The test effectively expands outward from elements on the device under test to the edge pins of the device.

Figure 5:
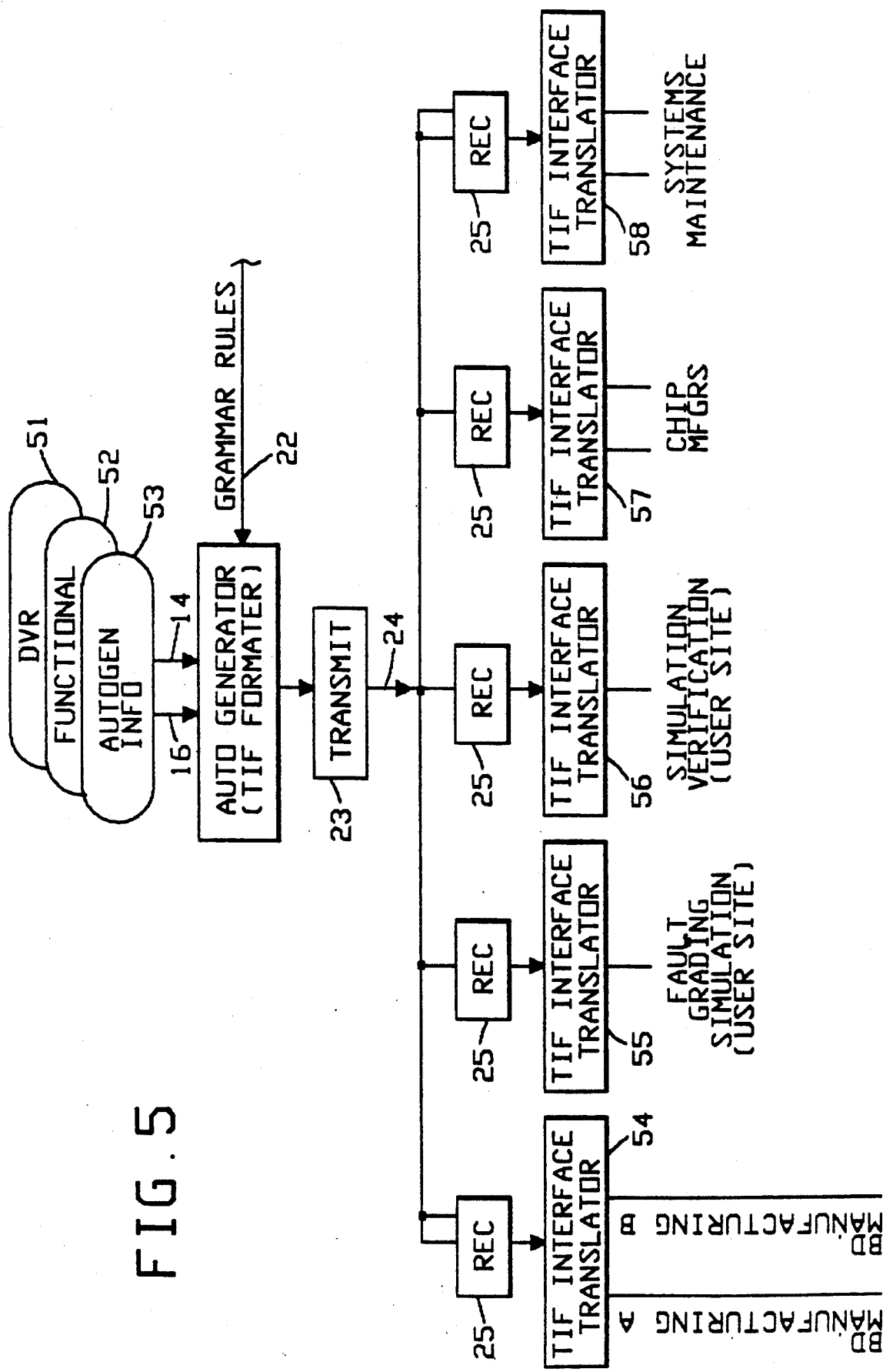
FIG. 5 is a block diagram showing the preferred embodiment combination of uses of a plurality of translators.

Refer now to FIG. 5 showing a block diagram of a combinational use of the TIF test list (Appendix A) which is transmitted to different locations each having their own translators 21. The information supplied to the autogenerator 17 on lines 14 and 16 has been discussed hereinbefore with reference to FIG. 1. The information shown as design verification routines 51, functional test 52 and autogenerator test information 53 were previously shown in FIG. 2 as inputs to the autogenerator 17. Grammar rules are applied to the autogenerator via line 22 to produce the TIF formatted information on line 18 which includes both the header information and the vector information referred to at blocks 311 and 315 respectively of FIG. 2. The information on line 18 is ready to be transmitted to the receiver via a transmitter 23 or recorded on a tape or other means for physical transmission to the user site of the vendor's tester platform 19 as shown in FIG. 1. It will now be understood that the same information transmitted via line 24 to a data receiver 25 may comprise a plurality of receivers 25 as shown in FIG. 5. The first receiver 25 is shown connected to a TIF interface translator 54 of the type previously referred to as a translator 21 which has a grammar rules input 22. The translator 54 is shown providing information for the circuit board manufacturers A and B.

The second TIF interface translator 55 is also provided with the output of a receiver 25 and is coupled to a grading fault simulation system at the user's site which may or may not be the same site as the board manufacturer and/or the chip manufacturer to be discussed hereinafter. The third TIF interface translator 56 is shown coupled to a receiver 25 to provide a formatted and decoded simulation code for use with simulation verification at a same user site or different user site.

A fourth TIF interface translator 57 is coupled to a similar receiver 25 to provide decoded tester code for testing semiconductor devices at a plurality of semiconductor manufacturing sites which may be located anywhere in the United States or abroad.

A fifth TIF interface translator 58 is coupled to a receiver 25 to provide decoded test information for use in maintenance controllers for use in system test and manufacturing or for field maintenance.

It will be understood that the Appendix A header information is common to all of the different users having translators 54 to 58. However, the test information shown in vector format may only be valid for one or more of the users of the test information shown in FIG. 5. For example, the TIF test list information shown in Appendix A is not usable at TIF interface translator 58 but is usable at the other translator sites.

Having explained a preferred embodiment of the present invention with reference to a circuit design group 11 that initiated the design and test information for the hybrid multicircuit board discussed in the preferred embodiment it will be understood that circuit boards, substrate circuits for hybrid chip set circuits and board circuits having a plurality of semiconductor chips mounted thereon can be tested with the TIF autogenerated information in the various stages of manufacture leading up to the final assembly of a multicircuit board. Further, once the boards are incorporated into a system further TIF interface information can be provided to a translator 58 which defines test procedures for testing a system comprising a plurality of such multicircuit boards.

A feature of the present invention is that the translator 21 using the program rules of Appendix B is totally independent of the vendor's tester platform. However, the vendor and the vendor tester manufacturer is responsible for creating an interface to use the standardized information in a manner which automatically provides the test information for the vendors test platform 19. Thus, it will be appreciated that the type of autogeneration employed to generate Appendix A is not universally applicable to autogeneration of the decoded test information because each of the vendors test platforms are usually custom made and have some differences even though manufactured by the same vendor manufacturer. Employing the standard information in a translator 21, the interface between the translator and the vendor's tester is properly constructed either with hardware or software and the test procedures defined at the circuit designer group 11 will be carried out substantially the same and in identical routine procedures regardless of the tester platform employed. The common information in the translator 21 may be further modified by the code generation library 141A discussed with reference to FIG. 3 to provide decoded test information to any particular test platform logic tester or memory tester used by the manufacturer of the semiconductor devices or the multicircuit boards.

Having explained a preferred embodiment of the present invention with emphasis on the autogeneration of a tester independent format list of the type presented on output line 18 and shown as an input to block 319 it will be appreciated that the TIF 3.0 test list 319 may be electronically transmitted via telephone line 24 or other means to a data receiving station 25 or alternatively may be recorded on a tape or disk in a format which may be read directly by translator 21 which applies grammar rules 22 to produce the usable code and procedures on line 20 to the vendor's test platform 19. The advantage of compacting the procedure presented on line 20 in a test list format at line 18 serves three primary purposes. Every user can be provided immediately with any change in test list information electronically and machine readable form. Such electronic transmission employing state of the art communications equipment verifies that the TIF test list transmitted was received as transmitted so that no errors occur at the test site. Thus, updated test lists may be electronically transmitted to the user's site so that no user is employing obsolete test information. Since the test list information is in compactive or compressed machine readable form, such transmission of the test list is accomplished in a short period of time efficiently and economically. While the test list may change for different chips and different hybrid multicircuit boards, the grammar rules remain substantially the same at all user sites. Further, since the test format allows the test programmer to express his test in a natural sequence and convenient routine, less time is spent generating and changing test list.

In order to provide a more complete disclosure, there are provided two appendices comprising computer program listings which are printouts of information employed in the preferred embodiment of the present invention. The appendices have been referred to in the descriptive portion of the preceding specification as follows:

Appendix A is a typical Test List Information (TIF) printout for a high density gate array chip, part of which is reproduced in Table 1; and · Appendix B is a printout of a set of "Grammar Rules" including examples of use employed by the autogenerator to compact or encode the test information and further employed by the translator to expand or decode the encoded TIF information.

The above appendices are not part of the printed patent but are available in the Patented File as provided for in 37 CFR 1.96(b).

What we claim is:

1. A system for transmitting information from a source of designing electrical circuits to a source of manufacturing electrical circuits, which information is used in testing an electrical circuit at said source of manufacturing electrical circuits, comprising in combination:

electric circuit design means formed to design at least one particular circuit;

autogeneration means connected to said electrical circuit design means to receive information therefrom related to said particular circuit, said autogeneration means formed to create a compacted information program including truth table concepts, related to said particular circuit, whereby when said information program is implemented said truth table concepts cause certain aspects of said particular circuit to be tested;

information communication means having first and second stations with said first station connected to said autogeneration means to receive said compacted information program therefrom, said first station formed to transmit said compacted information program to said second station;

translation means connected to said second station to receive said compacted information program therefrom, said translation means formed to expand said compacted information program into said truth table concepts; and testing means connected to said translation means to receive said truth table concepts and formed to apply signals representing said truth table concepts to said particular circuit to effect testing thereof.

2. A system according to claim 1 whereby said autogeneration means includes memory means having raw information stored therein and electronic data processing means, and wherein said raw information includes a set of grammar rules which act to compact and define concepts, which concepts direct said testing means to employ certain signals to effect testing of said particular circuit.

3. A system according to claim 2 wherein said raw information further includes waveform information, which waveform information acts to cause certain waveform signals to be applied in said testing means to effect testing of said particular circuit.

4. A system according to claim 2 wherein said raw information further includes information about circuit pins of said particular circuit and which information about circuit pins further provides the basis for having signals applied to said circuit pins to effect certain electrical test aspects of said particular circuit.

5. A system according to claim 2 wherein said raw information further includes information related to timing signals, which information related to timing signals provides a basis for generating and applying timing aspects to signals applied to said particular circuit to effect testing certain aspects of said particular circuit.

6. A system according to claim 1 wherein said autogeneration means has first and second electronic data processing means and wherein said raw information is manipulated in said first electronic data processing means to provide a set of header concepts and wherein said second electronic data processing means is formed to employ said header concepts to generate a set of vector concepts to provide truth table concepts to be applied to said testing means.

7. A system according to claim 6 wherein said header concepts include a first set of information concepts and wherein said header concepts further include group information concepts, which group information concepts comprise certain of said first set of information concepts as well as a group identifier.

8. A system according to claim 7 wherein said header information further includes MACRO instructions and wherein said MACRO instructions are formed to include group identifiers as well as other MACRO instructions.

9. A method for translating compacted information related to testing at least one circuit means, which one circuit means includes logic circuits and which one circuit means is formed to have a plurality of input means available for signals to be applied thereto and formed to have a plurality of output means available to have signals read therefrom, comprising the steps of:
 a) defining and generating, in machine readable language, a plurality of first phase signal concepts which are available to be employed to expand a compacted information program, and which first phase signal concepts include timing concepts, waveform concepts, and circuit hardware identifiers;
 b) defining and generating, in machine readable language, a plurality of group identifiers each of which represents a different collection of said first phase signal concepts;
 c) defining and generating, in machine readable language, a plurality of MACRO instructions each of which represents a different collection of group identifiers and alternatively a different collection of group identifiers plus other MACRO instructions; and
 d) defining and generating, in machine readable language, a plurality of different sets of vector signal concepts with each different set of vector signal concepts including selected ones of said MACRO instruction concepts.

10. A method for transferring information related to testing at least one circuit means, which one circuit means includes logic circuits and which one circuit means is formed to have a plurality of input means available for signals to be applied thereto and formed to have a plurality of output means available to have signals read therefrom, comprising the steps of:
 a) defining and generating, in machine readable language, a plurality of different waveforms to be used for application to selected ones of said input means and with each of said different waveforms having a different first identifier;
 b) defining and generating in machine readable language at least one cycle time in which certain test signals are applied;
 c) defining and generating, in machine readable language, different second identifiers each of which represents a different one of said input means to which certain signals may be applied;
 d) defining and generating, in machine readable language, different third identifiers each of which represents a different one of said output means from which signals may be read;
 e) defining and generating, in machine readable language, at least a fourth identifier for a particular one of said input means to have clock signals applied thereto;
 f) defining and generating, in machine readable language, different fifth identifiers each of which represents a different one of said logic circuits to which signals may be applied;
 g) defining and generating, in machine readable language, different first groups of associated signals with each of said first groups of associated signals having different sixth identifiers and with each of said first groups of associated signals including related ones of said first identifiers as well as others of said identifiers.
 h) defining and generating, in machine readable language, different second groups of associated signals with each of said second groups of associated signals having different seventh identifiers and with each of said second groups of associated signals including related ones of said second identifiers;
 i) defining and generating, in machine readable language, at least third groups of associated signal concepts which defines certain logic circuits and which has an eighth identifier;
 j) defining and generating, in machine readable language, a plurality of different MACRO instructions with each of said different MACRO instructions having a different ninth identifier and each MACRO instruction having selected different ones of said sixth, seventh and eighth identifiers; and
 k) defining and generating, in machine readable language, a plurality of different sets of vector signal concepts with each different set of vector signal concepts including selected ones of said ninth identifiers which in turn expand into sixth, seventh, and eighth identifiers which in turn expand into information signals, represented by said first, second, third, fourth and fifth identifiers to effect a test of said circuit means.

11. A system for preparing compacted test information, at a site for designing high density electrical circuits, for use at a site for manufacturing electrical circuits, which test information is used in testing electrical circuits at said site for manufacturing electrical circuits, comprising in combination:
 CAD electric circuit design means formed to design at least one particular multicircuit;
 autogeneration means connected to said CAD electrical circuit design means to receive information therefrom related to said particular multicircuit, said autogeneration means formed to create a compacted test information program including truth table concepts in compacted vector format related to said particular circuit, whereby said test information program is directly decodable into said truth table concepts, in machine readable form, for use by a predetermined test platform to test certain aspects of said particular circuit to be tested,
 memory means adapted for receiving and storing said compacted test information,
 translation means adapted to be coupled to said memory means to receive said compacted test information program therefrom, said translation means formed to expand said compacted test information program into said truth table concepts, and to decode test procedures usable by said predetermined test platform, and
 test platform means connected to said translation means to receive said truth table concepts and said test procedures and formed to apply signals representing said truth table concepts and said test procedures to said particular multicircuit to effect testing thereof.

12. In a system for preparing compacted test information for use at a site for manufacturing electrical circuits, which test information is used in testing electrical circuits at said site for manufacturing electrical circuits, comprising in combination:

memory means for storing compacted test information, said memory means containing header information and truth table concepts information in vector formats and machine readable form, translator means connected to said memory means for receiving said compacted test information in machine readable form, said translator means comprising scanner means coupled to said memory means for decoding and expanding said compacted test information, and test platform means coupled to said translator means for receiving said decoded expanded test information.

13. In a system according to claim 12 wherein said translator further comprises parser means coupled to said scanner means.

14. In a system according to claim 13 wherein said translator means further comprises vector view logic means.

15. In a system according to claim 14 wherein said translator means further comprises a plurality of operation procedures means cyclically coupled to said vector view logic means.

16. In a system according to claim 15 wherein said translator means further comprises calling program means coupled to said operational procedure means for activating said operational procedures.

17. In a system according to claim 16 wherein said translator means further includes symbol table means coupled to said vector view logic means and associated ones of said operational procedure means.

* * * * *